United States Patent
Ho et al.

(10) Patent No.: US 9,476,943 B2
(45) Date of Patent: Oct. 25, 2016

(54) SOLENOID STATUS DETERMINATION METHODS AND SYSTEMS

(71) Applicant: Siemens Industry, Inc., Alpharetta, GA (US)

(72) Inventors: Yuh-Jing Ho, Flower Mound, TX (US); Stephen Lawrence Dillier, Irving, TX (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 682 days.

(21) Appl. No.: 13/668,864

(22) Filed: Nov. 5, 2012

(65) Prior Publication Data

US 2014/0129159 A1    May 8, 2014

(51) Int. Cl.
*G01R 21/02* (2006.01)
*G01R 31/327* (2006.01)
*H01F 7/18* (2006.01)

(52) U.S. Cl.
CPC ......... *G01R 31/3278* (2013.01); *H01F 7/1844* (2013.01)

(58) Field of Classification Search
USPC ........................................................ 702/58
See application file for complete search history.

(56) References Cited

U.S. PATENT DOCUMENTS 6,111,514 A * 8/2000 Cossins ................... B60T 8/885
                                                      340/654
6,326,898 B1 * 12/2001 O'Leyar et al. ............. 340/635

OTHER PUBLICATIONS

Emerson Industrial Automation (2011) in Current Concerns How Some Supervisory and Leakage Currents Can Affect Today's Low-Power Solenoid Valves, 11 pages.*
Hsun-Heng Tsai in Detecting Solenoid Valve Deterioration in In-Use Electronic Diesel Fuel Injection Control Systems (Sensors 2010), pp. 7157-7169.*

* cited by examiner

*Primary Examiner* — Tung Lau (57) ABSTRACT

Methods and systems for determining the status of a solenoid. A method includes measuring a plurality of parameters associated with a current conducting through the solenoid. The measured parameters are compared to predetermined reference parameters to determine the status of the solenoid. A system includes a sensor configured to measure a plurality of parameters associated with a current conducting through the solenoid. The system includes a control module configured to receive the measured parameters and operable to compare the measured parameters to predetermined reference parameters to determine the status of the solenoid.

9 Claims, 7 Drawing Sheets

SOLENOID STATUS DETERMINATION METHODS AND SYSTEMS

TECHNICAL FIELD

The present disclosure is directed, in general, to methods and systems for determining the status of a solenoid.

BACKGROUND OF THE DISCLOSURE

In many industrial applications, solenoid switches are used to convert electrical energy into linear motion. For example, in industrial conveyors for transporting packages and other items, solenoid switches are frequently used to push a diverter gate to divert a package.

A solenoid switch includes an electromagnetically inductive coil, wound around a movable armature. The coil is shaped such that the armature can be moved in and out of the center, altering the coil's inductance and thereby becoming an electromagnet. The armature provides a mechanical force which may be utilized, for example, to push a diverter gate to divert a package in a conveyor.

In industrial conveyors, a diverter control module may be used to control the operation of a solenoid switch. The diverter control module typically determines the timing of a solenoid switch. Current diverter control modules present significant limitations and drawbacks. For example, current modules generally do not provide information regarding the condition of a solenoid switch. Also, current modules do not provide any early warning of a potential switch failure. Also, current diverter control modules generally are not capable of detecting and reporting a mechanical failure or an obstruction which may prevent normal operation of a solenoid switch. Failure to detect a malfunctioning solenoid switch could potentially cause significant damage to the industrial conveyor.

SUMMARY OF THE DISCLOSURE

Various disclosed embodiments include methods and systems for determining the status of a solenoid switch. A method for determining the status of a solenoid switch includes measuring a plurality of parameters associated with a current conducting through the solenoid. The measured parameters include an end of stroke time ($T_{end}$), an end of stroke current ($I_{end}$), a reference time ($T_{ref}$), a reference current ($I_{ref}$), and an instantaneous current ($I(t)$). The solenoid switch is determined to be in a satisfactory state, if $T_{end}$ is less than or equal to a good threshold time, ($T_{good}$) but greater than a minimum threshold time, ($T_{min}$). The solenoid switch is determined to be in a warn state, if $T_{end}$ is greater than $T_{good}$, but less than or equal to a maximum threshhold time, ($T_{max}$). The solenoid switch is determined to be in a failed state, if $T_{end}$ is greater than $T_{max}$. The solenoid switch is determined to be in a shorted state or blocked from moving if $I_{ref}$ is greater than the maximum rated current of the coil ($I_{coil\_max}$) and no Tend could be determined. The solenoid switch is determined to be in an open state if $I_{ref}$ is less than the minimum coil current ($I_{coil\_min}$). The solenoid switch is determined to be in a failed state if $T_{end}$ cannot be identified. The solenoid switch is determined to be in an obstruction state if $T_{end}$ is less than $T_{min}$.

A system for determining the status of a solenoid switch includes a sensor configured to measure a plurality of parameters associated with a current conducting through the solenoid, the parameters including an end of stroke time ($T_{end}$), an end of stroke current ($I_{end}$), a reference time ($T_{ref}$), a reference current ($I_{ref}$), and an instantaneous current ($I(t)$). The system includes a control module configured to receive the measured parameters and operable to compare the measured parameters to predetermined reference parameters to determine the status of the solenoid switch.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will recognize that the principles of the present disclosure may be implemented in any suitably arranged device. The numerous innovative teachings of the present application will be described with reference to exemplary non-limiting embodiments.

Various disclosed embodiments provide significant improvements in a control module. Specifically, various embodiments include a control module that provides information regarding the condition of a solenoid, which may assist in maintenance or trouble-shooting of the solenoid. Also, various embodiments include a control module capable of detecting and reporting a mechanical failure or an obstruction which may prevent normal operation of the solenoid.

Figure 1:
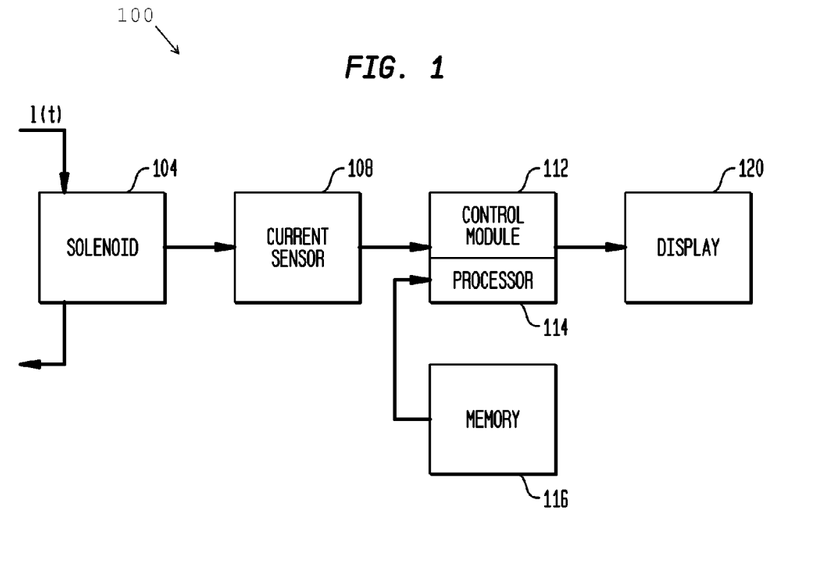
FIG. 1 illustrates a system for determining the status or condition of a solenoid in accordance with disclosed embodiments.

FIG. 1 illustrates a system 100 for determining the status or condition of a solenoid 104 in accordance with disclosed embodiments. The solenoid 104 may, for example, be used to push a diverter gate to divert a package being transported by a conveyor.

When the solenoid 104 is turned ON (i.e., energized), a current I(t) conducts through the solenoid 104, which magnetizes the solenoid 104, causing the solenoid to move from an initial position to a final position. A sensor 108 coupled to the solenoid 104 is configured to measure a plurality of parameters associated with the current I(t). A control module 112 coupled to the sensor 108 receives the measured parameters. According to some disclosed embodiments, the sensor 108 may be incorporated into the control module 112. The sensor 108 measures the current as the solenoid moves through its stroke. The control module 112 compares the measured parameters to predetermined reference parameters. According to disclosed embodiments, a processor 114 inside the control module 112 may be configured to compare the measured parameters to the predetermined reference parameters. The predetermined reference parameters may be stored in a memory 116 coupled to the control module 112.

Based on the comparison, the control module 112 determines the status or condition of the solenoid 104. The control module 112 may display the status or condition on a display 120. The status or condition assists in maintenance or trouble-shooting of the solenoid 104.

Figure 2:
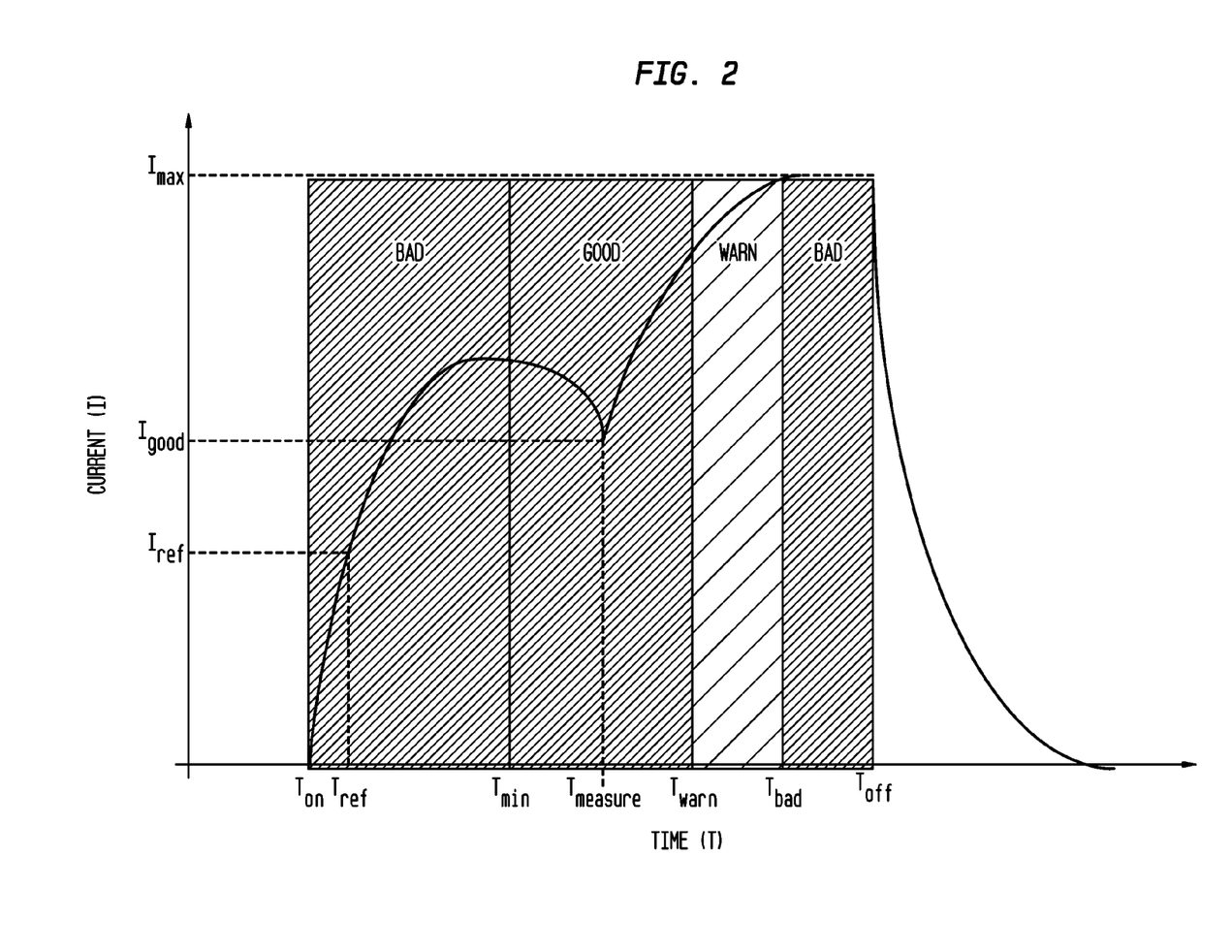
FIG. 2 illustrates an exemplary current waveform through the solenoid during normal operation and an exemplary timeline for a stroke.

FIG. 2 illustrates an exemplary current waveform I(t) conducting through the solenoid 104 when the solenoid 104 is operating satisfactorily. At time $T_{ON}$, the solenoid 104 is turned ON, and in response, the current I(t) rises in the solenoid 104. A plurality of parameters associated with I(t) are then measured by the sensor 108.

According to disclosed embodiments, the measured parameters may include, but are not limited to: (1) a reference current ($I_{ref}$) conducting through the solenoid 104 at a reference time ($T_{ref}$); (2) an end of stroke time ($T_{end}$) defined by the time required for the solenoid 104 to move from the initial position to the final position; (3) an end of stroke current ($I_{end}$) defined by the current conducting through the solenoid 104 at $T_{end}$; and (4) an instantaneous current I(t).

Referring again to FIG. 2, $T_{end}$ is preceded by a fall of the current I(t) followed by a rapid rise of the current I(t) In FIG. 2 $T_{end}$ is indicated as $T_{measure}$, and $T_{end}$ and $T_{measure}$ are used interchangeably in this document.

At the end of its mechanical strike the solenoid stops moving and may be considered in a stalled state which is characterized by a rapid rise of the current I(t). At time $T_{OFF}$, the solenoid 104 is turned OFF, which causes the current I(t) to rapidly decline.

According to disclosed embodiments, the sensor 108 measures the parameters associated with the solenoid current periodically. According to some embodiments, the parameters are initially measured 7 ms after the solenoid 104 is turned ON and the measurement is repeated at an interval of 250 micro-seconds. The average value of 4 consecutive measurements is calculated and recorded, and the process is repeated until $T_{off}$. The measured parameters and the calculated values may be stored in an array in the memory 116 for subsequent comparison and analysis.

The control module 112 analyzes the measured parameters and identifies a dip in the current followed by a rise in the current. According to disclosed embodiments, the time $T_{end}$ is indicated by the end of the current dip. According to disclosed embodiments, if $T_{end}$ is less than or equal to $T_{good}$ but greater than a minimum threshold time ($T_{min}$), the solenoid is determined to be in a satisfactory state.

Figure 3:
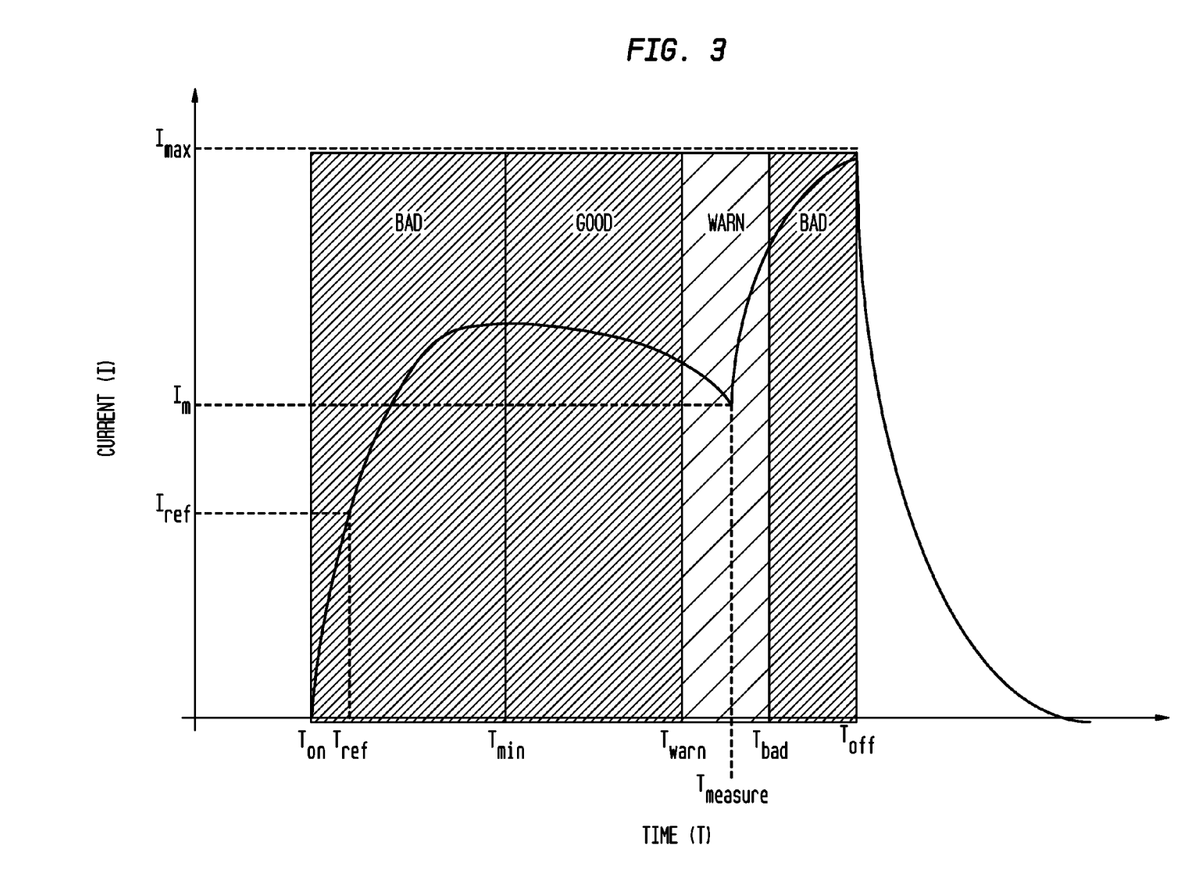
FIGS. 3-6 illustrate current waveforms through the solenoid when the solenoid switch is not operating properly.

FIG. 3 illustrates a scenario wherein a solenoid switch is wearing out and is not operating as fast as a normally operating solenoid switch. As shown in FIG. 3, $T_{end}$ (indicated as $T_{measure}$ in FIG. 3) is greater than $T_{min}$ and less than or equal to $T_{bad}$.

Figure 4:
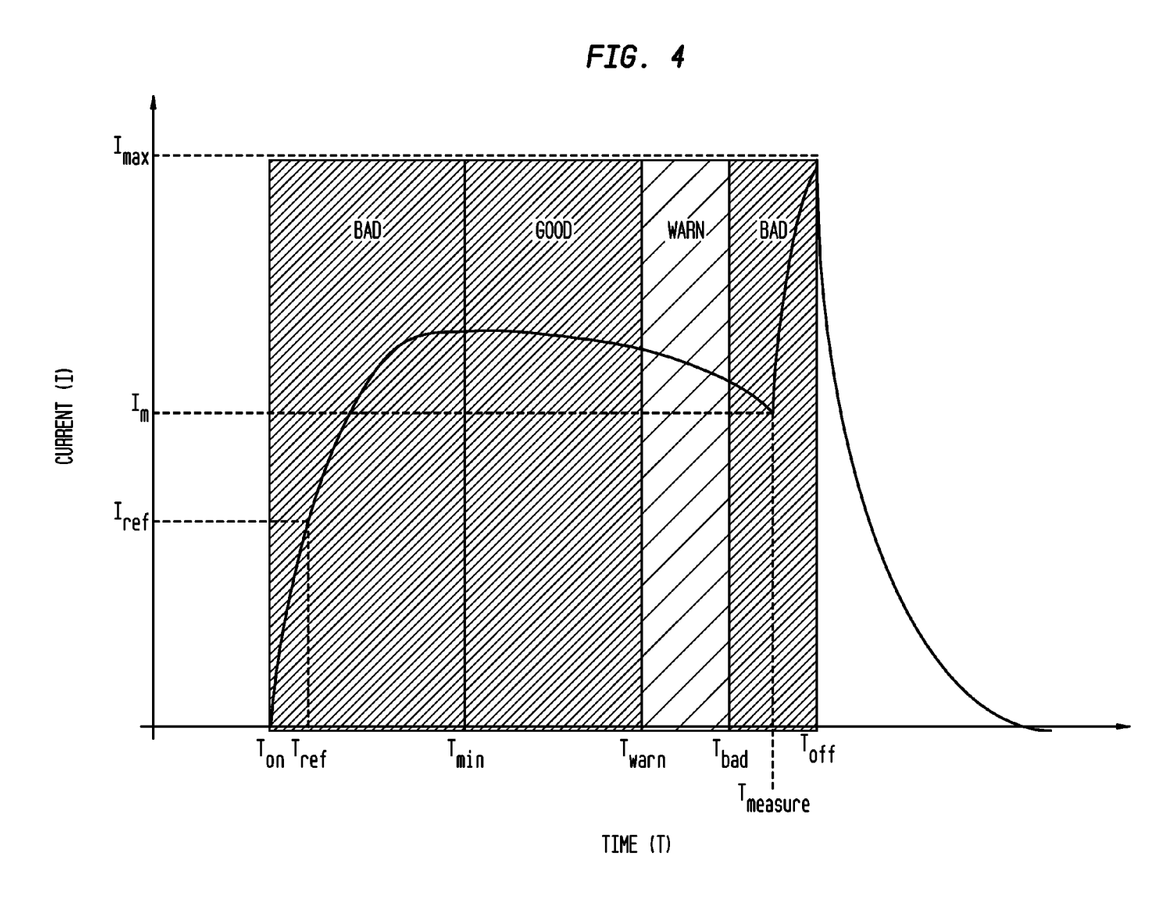

FIG. 4 illustrates a scenario wherein a solenoid switch has worn out and is not operating as fast as a normally operating solenoid switch. As shown in FIG. 4, $T_{end}$ (indicated as $T_{measure}$ in FIG. 4) is greater than $T_{bad}$.

Figure 5:
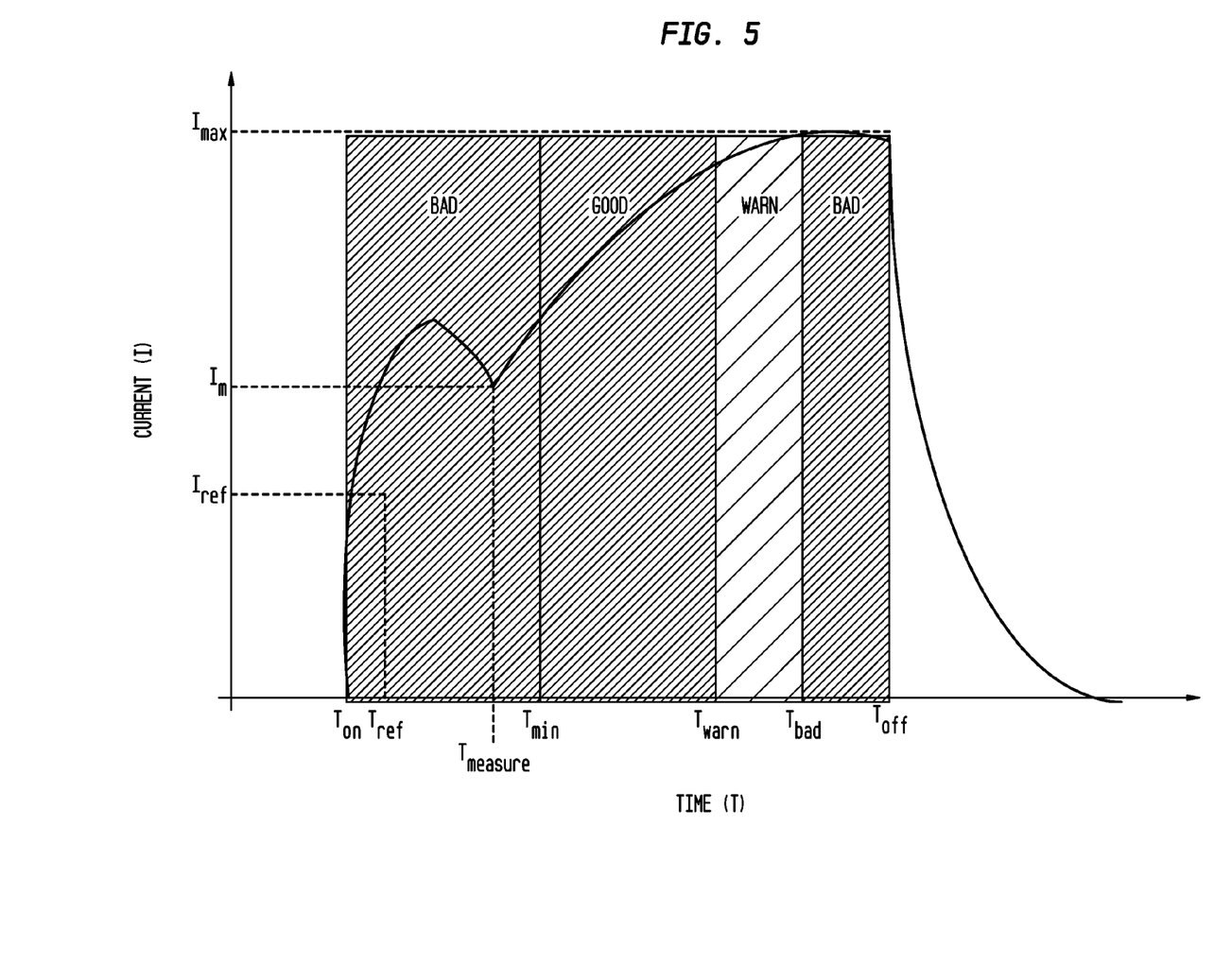

FIG. 5 illustrates a scenario wherein a solenoid switch is obstructed from moving mechanically to the end of its normal travel. As shown in FIG. 5, $T_{end}$ (indicated as $T_{measure}$ in FIG. 5) is less than $T_{min}$.

Figure 6:
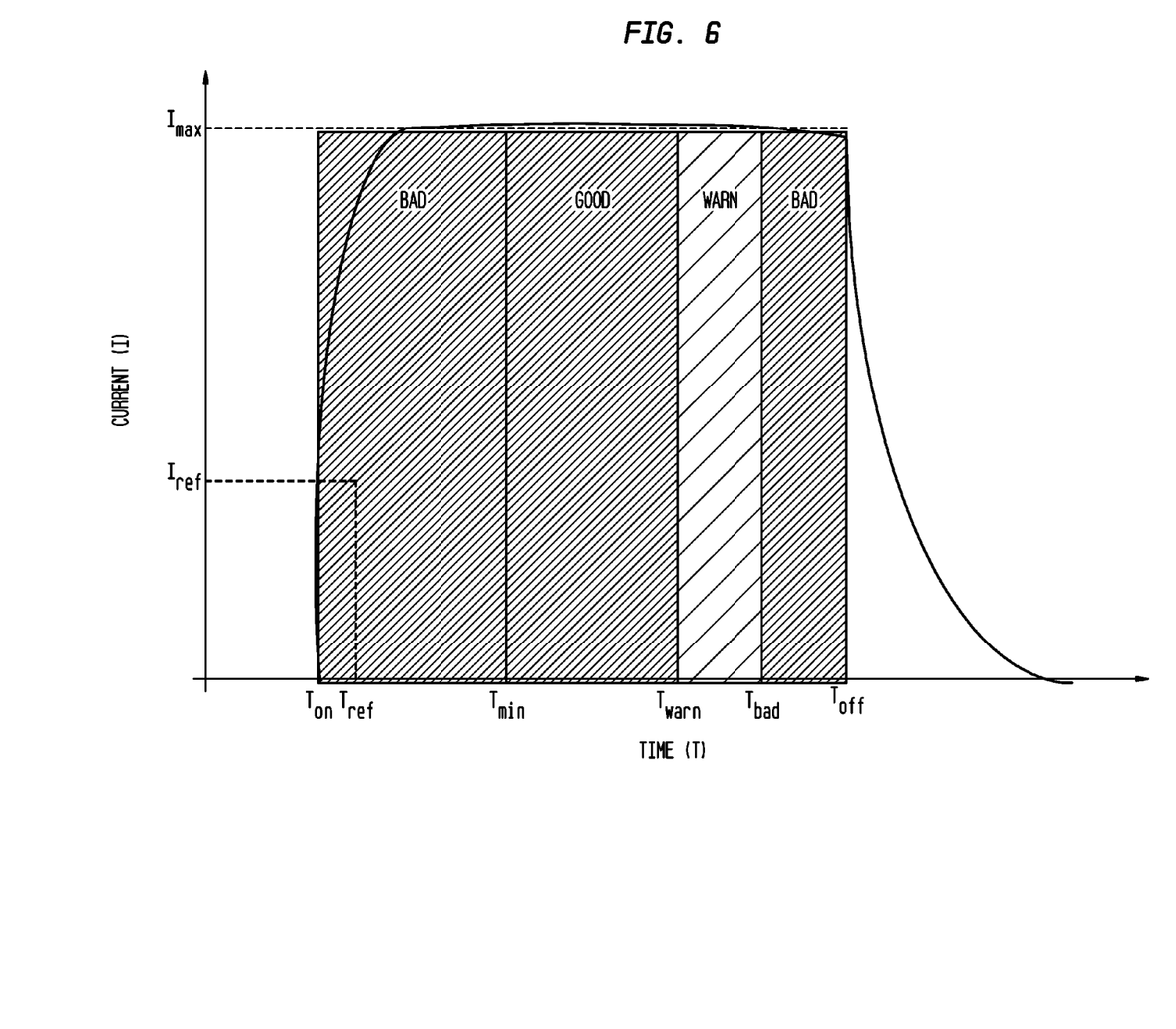

FIG. 6 illustrates a scenario wherein a mechanical failure prevents the solenoid 104 from moving or the solenoid winding is shorted. For example, a mechanical failure may cause the solenoid 104 to remain stalled between the initial and final positions, which may cause the current I(t) to remain high between $T_{on}$ to $T_{off}$. Thus, as shown in FIG. 6, the current I(t) does not exhibit a dip.

Figure 7:
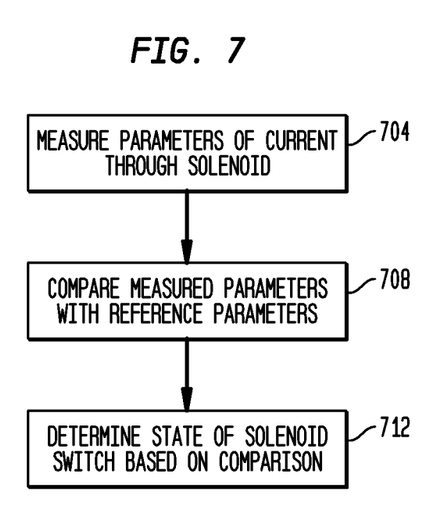
FIG. 7 illustrates a flowchart of a process in accordance with disclosed embodiments.

FIG. 7 is a flowchart of a process in accordance with disclosed embodiments. Such a process can be performed, for example, by a system 100 as described above, but the "system" in the process below can be any apparatus configured to perform a process as described.

In this exemplary process, $T_{end}$ represents the time required for the solenoid to travel from an initial position to a final position after the solenoid is turned ON, and may be referred to as a stroke time; $I_{end}$ represents the current conducting through the solenoid at $T_{end}$, and maybe referred to as a stroke current; and $I_{ref}$ is the current conducting through the solenoid at $T_{ref}$ and may be referred to as a reference current; and I(t) may be used to refer to the instantaneous current through the solenoid. A maximum threshold time may be referred to as $T_{max}$, and a minimum threshold time may be referred to as $T_{min}$.

In some cases, $T_{end}$ is preceded by at least a 70% fall followed by at least a 150% rise in the current flowing through the solenoid. In some cases, the solenoid enters a stall state at $T_{end}$ which causes at least a 150% rise in the current flowing through the solenoid. In the mechanical failure state, the solenoid can remain between the initial and the final positions, and in the obstruction state, the solenoid may be prevented by an object from moving to the final position.

In a block 704, the system measures a plurality of parameters associated with the current conducting through the solenoid switch. This step can include evaluating the measured current to identify $T_{end}$ as determined by a drop in the current followed by a rise in the current.

In a block 708, the system compares the measured parameters to predetermined reference parameters.

In a decision block 712, the system determines the state of the solenoid switch based on the comparison. As discussed before, the measured parameters include the end of stroke time ($T_{end}$), an end of stroke current ($I_{end}$), the reference time ($T_{ref}$), the reference current ($I_{ref}$), and an instantaneous current (I(t)). The solenoid switch is determined to be in a satisfactory state if $T_{end}$ is less than or equal to a good threshold time ($T_{good}$) but greater than a minimum threshold time ($T_{min}$). The solenoid switch is determined to be in a warn state if $T_{end}$ is greater than $T_{good}$, but less than or equal to a maximum threshold time ($T_{max}$). The solenoid switch is determined to be in a failed state if $T_{end}$ is greater than $T_{max}$. The solenoid switch is determined to be in a shorted state or blocked from moving if $I_{ref}$ is greater than the maximum rated current of the coil ($I_{coil\_max}$) and no $T_{end}$ could be determined. The solenoid switch is determined to be in an open state if $I_{ref}$ is less than the minimum coil current a ($I_{coil\_min}$). The solenoid switch is determined to be in a failed state if $T_{end}$ cannot be identified. The solenoid switch is determined to be in an obstruction state if $T_{end}$ is less than $T_{min}$.

According to embodiments, a computer program product embodies a non-transitory computer-readable medium having program logic recorded thereon for determining the status or condition of a solenoid. The computer program product includes code operable at a $_{control}$ module for comparing a plurality of measured parameters associated with a current conducting through the solenoid to predetermined reference parameters to determine the status or condition of the solenoid.

Those skilled in the art will recognize that, for simplicity and clarity, the full structure and operation of all systems suitable for use with the present disclosure is not being depicted or described herein. Instead, only so much of a system as is unique to the present disclosure or necessary for an understanding of the present disclosure is depicted and described. The remainder of the construction and operation of the disclosed systems may conform to any of the various current implementations and practices known in the art.

Of course, those of skill in the art will recognize that, unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. An operational condition sensing system for determining the status of a solenoid, comprising:
    a current sensor configured to measure a plurality of parameters associated with a current conducting through the solenoid during operation for a stroke, the parameters including an end of stroke time ($T_{end}$), an end of stroke current ($I_{end}$), a reference time ($T_{ref}$), a reference current ($I_{ref}$), and an instantaneous current (I(t));
    a memory configured to store the measured plurality of parameters during operation for the stroke in an array for subsequent comparison and analysis;
    a control module coupled to the current sensor, the control module capable of detecting and reporting a mechanical failure and an obstruction which prevents operation of the solenoid, the control module is configured to receive measured parameters from the memory and operable to compare the measured parameters to predetermined reference parameters to determine the status of the solenoid,
    wherein the solenoid is determined to be in a first state if $T_{end}$ is less than or equal to a first threshold time ($T_{good}$) but greater than a second threshold time ($T_{min}$),
    wherein the solenoid is determined to be in a second state if $T_{end}$ is greater than $T_{good}$, but less than or equal to a third threshold time ($T_{max}$),
    wherein the solenoid is determined to be in a third state if $T_{end}$ is greater than $T_{max}$ or if $T_{end}$ cannot be identified,
    wherein the solenoid is determined to be in a fourth state if $I_{ref}$ is greater than a maximum rated coil current ($I_{coil\ max}$) and no $T_{end}$ is determined, and
    wherein the solenoid is determined to be in a fifth state if $I_{ref}$ is less than a minimum rated coil current ($I_{coil\ min}$); and
    a display coupled to the control module, the display is configured to display the status of the solenoid for assisting in maintenance or troubleshooting of the solenoid based on the mechanical failure and the obstruction of the solenoid.

2. The system of claim 1, wherein $T_{end}$ is indicated by an end of a dip in the current conducting through the solenoid followed by a rise in the current.

3. The system of claim 1, further comprising a processor associated with the control module, the processor configured to compare the measured parameters with the predetermined reference parameters.

4. The system of claim 1, wherein the memory coupled to the control module, the memory configured to store the predetermined reference parameters.

5. The system of claim 1, wherein $I_{end}$ represents the current conducting through the solenoid at $T_{end}$.

6. The system of claim 1, wherein $I_{ref}$ is the current conducting through the solenoid at $T_{ref}$.

7. The system of claim 1, wherein the control module evaluates a measured current to identify the $T_{end}$.

8. The system of claim 1, wherein the solenoid is determined to be in a sixth state if $T_{end}$ is less than $T_{min}$.

9. The system of claim 8, wherein $T_{end}$ represents time required for the solenoid to move from an initial position to a final position after the solenoid is turned ON, wherein the solenoid remains between the initial and the final positions in a mechanical failure state.

* * * * *